(12) United States Patent
Shi

(10) Patent No.: US 11,374,573 B2
(45) Date of Patent: Jun. 28, 2022

(54) SUBTHRESHOLD RATIOED LOGIC CIRCUIT AND CHIP

(71) Applicant: SHENZHEN UNIVERSITY, Guangdong (CN)

(72) Inventor: Weiwei Shi, Guangdong (CN)

(73) Assignee: SHENZHEN UNIVERSITY, Shenzhen (CN)

( * ) Notice: Subject to any disclaimer, the term of this patent is extended or adjusted under 35 U.S.C. 154(b) by 817 days.

(21) Appl. No.: 16/322,929

(22) PCT Filed: Jun. 25, 2018

(86) PCT No.: PCT/CN2018/092653
§ 371 (c)(1),
(2) Date: Feb. 2, 2019

(87) PCT Pub. No.: WO2019/223055
PCT Pub. Date: Nov. 28, 2019

(65) Prior Publication Data
US 2022/0103177 A1   Mar. 31, 2022

(30) Foreign Application Priority Data

May 24, 2018 (CN) .......................... 201810509898.3

(51) Int. Cl.
*H03K 19/17736* (2020.01)
*H03K 17/687* (2006.01)

(52) U.S. Cl.
CPC ... *H03K 19/17736* (2013.01); *H03K 17/6871* (2013.01)

(58) Field of Classification Search
None
See application file for complete search history.

(56) References Cited

PUBLICATIONS

Weiwei Shi et al., A Subthreshold Baseband Processor Core Design With Custom Modules and Cells for Passive RFID Tags, IEEE Transactions on Computer-Aided Design of Integrated Circuits and Systems, Jan. 2018, pp. 159-167, vol. 37, No. 1.
Weiwei Shi et al., A 90nm Passive RFID Tag's Custom Baseband Processor for Subthreshold Operation Below 0.3V, Chinese Journal of Electronics, Jul. 2017, pp. 720-724, vol. 26, No. 4.

*Primary Examiner* — Jany Richardson

(57) ABSTRACT

The present disclosure provides a subthreshold ratioed logic circuit and a chip. The subthreshold ratioed logic circuit comprises a pull-up module, a voltage regulation module, a pull-up PMOS transistor and a pull-down module that is turned on or off corresponding to the pull-up module; the first end of the pull-up module is connected to an external circuit, the second end of the pull-up module is connected to the source of the pull-up PMOS transistor, and a power supply, the third end of the pull-up module is connected to the second end of the voltage regulation module; the first end of the voltage regulation module is connected with a compensation adjustment circuit, and the third end of the voltage regulation module is grounded; the drain of the pull-up PMOS transistor connected to the output of the subthreshold ratioed logic circuit.

18 Claims, 2 Drawing Sheets

SUBTHRESHOLD RATIOED LOGIC CIRCUIT AND CHIP

TECHNICAL FIELD

The present disclosure relates to integrated circuit and chip field, and more particularly, to a subthreshold ratioed logic circuit and a chip.

BACKGROUND

It is considered that when the gate-source voltage $V_{GS}$ of MOS transistor is not higher than the threshold voltage $V_{th}$, the channel between the source and drain disappears and the MOS transistor is turned off. However, when $V_{GS}$ is close to $V_{th}$, there is still a certain leakage current $I_{leak}$ between the source and the drain, and it will be several orders of magnitude larger than when $V_{GS}=0$. This is because $I_{leak}$ grows exponentially with the increase of $V_{GS}$ when the source-drain voltage $V_{DS}$ is constant. However, in recent years, the wider demand for the RF passive components, IoT, Mobile interconnect node and ultra-low voltage processor will trigger a boom in the development of ultra-low-power digital modules, which greatly encourages research and development work on ultra-low-power digital system in chips. Reducing the operating voltage is one of the most effective methods without affecting the function. At the same time, as the transistor feature size in semiconductor processes has reduced into the ultra-deep submicron region, it can effectively suppress static power consumption, improve the energy efficiency of the circuit and maintain certain performance, when the specially designed digital system chip working at ultra-low power supply voltage.

The Pseudo-NMOS/PMOS circuit and the resistive load circuit are classic fast proportional logic circuits, however, in the case of ultra-low voltage, because of the pull-up load's current, the voltage of LOW-LEVEL output of the pseudo-NMOS is much higher than zero, and the output is an invalid output signal. In recent years, current mode and differential logic circuits, which have attracted attention in the field of low voltage applications, have solved some problem of signal integrity, but there are also some problems such as difficulty in voltage reduction (overlapping tail current NMOS) and excessive layout complexity.

When subthreshold power is supplied, no matter what logic style and circuit type are used, in addition to the voltage fluctuations, will bring a significant impact on the logic delay, the impact of process variation on circuit performance is also very obvious. The negative impact of process deviation on logic function is mainly reflected in that in the case of FS or SF (Fast NMOS, Slow PMOS & Slow NMOS, Fast PMOS), the logic swing of the output is unbalanced on one side and the signal is incomplete. The impact on speed is due to the high-low or low-high transition time of the output level by FS, SF or SS, which increases the logic delay.

SUMMARY OF THE DISCLOSURE

The present disclosure aims to provide a subthreshold ratioed logic circuit and a chip.

The present disclosure a subthreshold ratioed logic circuit, comprising a pull-up module, a voltage regulation module, a pull-up PMOS transistor, and a pull-down module corresponding to the pull-up module that is turned on or off;

the first end of the pull-up module is connected with an external circuit that provides an input signal, the second end of the pull-up module is connected with the source of the pull-up PMOS transistor and a power supply VDD, and the third end of the pull-up module is connected with the second end of the voltage regulation module;

the first end of the voltage regulation module is connected with a compensation adjustment circuit that provides a compensation signal, the third end of the voltage regulation module is grounded, and the connection node of the second end of the voltage regulation module and the third end of the pull-up module is also connected with the gate of the pull-up PMOS transistor;

the drain of the pull-up PMOS transistor is connected with the output of the subthreshold ratioed logic circuit, and the drain of the pull-up PMOS transistor is also connected with the second end of the pull-down module, and the first end of the pull-down module is connected with the external circuit, the third end of the pull-down module is grounded;

the pull-up module and the pull-down module are turned on or off according to the input signal, and control the pull-up current of the pull-up PMOS transistor in combination with the voltage regulation module, so that the output of the subthreshold ratioed logic circuit can quickly output a level signal;

wherein, the pull-up module, the pull-down module, and the voltage regulation module are all subthreshold conduction states when turned on.

In an embodiment, the pull-up module comprises multiple parallel pull-up branches, the both ends of all of the pull-up branches are respectively connected in parallel, and the both parallel connection nodes at both ends are taken as the second end and the third end of the pull-up module.

In an embodiment, each of the pull-up branches comprises a plurality of MOS transistors connected in series, the gate of all of the MOS transistors forms the first end of the pull-up module, and the gate of each of the MOS transistors is independently connected with the external circuit.

In an embodiment, each of the pull-up branches comprises two MOS transistors connected in series, and the two MOS transistors connected in series comprise a PMOS transistor and an NMOS transistor;

the sources of the PMOS transistors in all of the pull-up branches are connected in parallel, and the parallel connection node is connected to the source of the pull-up PMOS transistor as the second end of the pull-up module; the sources of the NMOS transistors in all of the pull-up branches are connected in parallel, and the parallel connection node is connected to the voltage regulation module as the third end of the pull-up module;

the drain of the PMOS transistor is connected with the drain of the corresponding NMOS transistor in each of the pull-up branches, the gate of the PMOS transistor and the gate of the NMOS transistor in each of the pull-up branches are respectively connected with the external circuit.

In an embodiment, the pull-down module comprises multiple parallel pull-down branches, the both ends of all of the pull-down branches are respectively connected in parallel, and the both parallel connection nodes at both ends are taken as the second end and the third end of the pull-down module.

In an embodiment, each of the pull-down branches of the pull-down module has a one to one corresponding with the pull-up branches of the pull-up module.

In an embodiment, each of the pull-down branches comprises a plurality of MOS transistors connected in series, the gate of all of the MOS transistors forming the first end of the pull-down module, and the gate of each of the MOS transistors is independently connected to the external circuit.

In an embodiment, each of the pull-down branches comprises two MOS transistors connected in series, and the two MOS transistors connected in series include a first NMOS transistor and a second NMOS transistor;

the drains of the first NMOS transistors in all of the pull-down branches are connected in parallel, and the connected nodes are connected with the drains of the pull-up PMOS transistors as the second ends of the pull-down modules; the sources of the second NMOS transistors in all of the pull-down branches are connected in parallel, and the connected nodes are grounded as the third end of the pull-down module;

the source of the first NMOS transistor is connected in series with the drain of the second NMOS transistor in each of the pull-down branches, and the gate of the first NMOS transistor and the second NMOS transistor in each of the pull-down branches are respectively connected to the external circuit.

In an embodiment, the voltage regulation module comprises two NMOS transistors connected in series;

the drain of one of the two series-connected NMOS transistors is connected with the gate of the pull-up module and the pull-up PMOS transistor as the second end of the voltage regulation module, and the source is connected with the drain of another NMOS transistor, the gate is connected with the gate of the another NMOS transistor and also connected with the compensation adjustment circuit;

the source of the another NMOS transistor is grounded as the third end of the voltage regulation module.

A chip having the above subthreshold ratioed logic circuit is further provided.

In the present disclosure, it can dynamically control the current of the pull-up PMOS transistor by the pull-up module according to the change of the input signal. Further optimizes the circuit structure and the layout area while guaranteeing speed advantage, Moreover, the power consumption can be maintained at a low level, at the same time the inventive digital integrated circuit to which the present invention is applied can operate in an ultra-low voltage, ultra-low power environment, and the instability of the digital integrated circuit during ultra-low voltage operation can be transmitted from the base, and the speed of the logic signal transmission can be improved, so that the circuit can maintain a certain performance in a low voltage environment.

BRIEF DESCRIPTION OF THE DRAWINGS

The present disclosure will be described in more detail with reference to the accompany drawings and the embodiments, wherein the drawings.

PREFERRED EMBODIMENTS

For a clearly understanding of technical features, purpose, and effect of the present disclosure, the embodiments are illustrated in detail with reference to the attached drawings.

It combined with a ratioed logic design method in the present disclosure to develop ultra-low voltage, ultra-low power consumption dedicated sub-threshold logic cells or base modules that can be used for human medical chips and passive devices and so on, and based on compatibility with popular digital circuit integrated system chips and portability considerations, the circuit in the present disclosure is based on research and design of the ultra-deep sub-micron or below standard CMOS processes. Specifically, in the present disclosure, by examining the advantages and disadvantages of various topological connection structures in realizing different logic functions, to analyze and simplify the number of equivalent transistors on the charge and discharge path based on subthreshold current equation, node capacitance and charge and discharge models. Under the premise of low power consumption and ultra-low supply voltage, we look for optimization schemes and integrations to reduce capacitive load, enhance capacitance control and performance, and propose a new sub-threshold proportional logic circuit.

Figure 1:
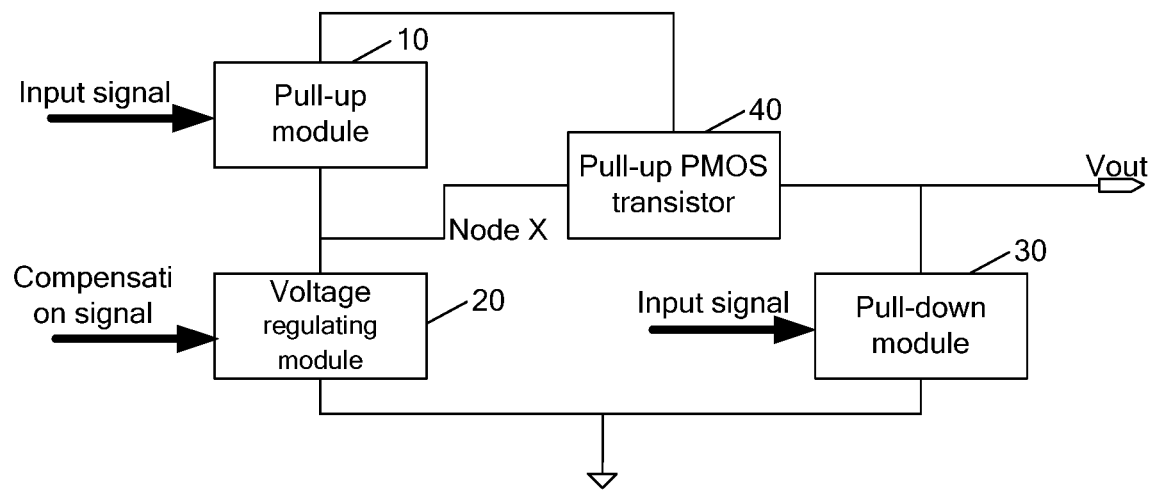
FIG. 1 is a functional block diagram of the subthreshold ratioed logic circuit of the present disclosure.

Referring to FIG. 1, FIG. 1 is a functional block diagram of the subthreshold ratioed logic circuit according to the present disclosure. The subthreshold ratioed logic circuit can be set in a dedicated sub-threshold logic cell or a base module, and can be applied to digital circuit integrated chips or passive RF chips.

As shown in FIG. 1, the subthreshold ratioed logic circuit comprises a pull-up module 10, a voltage regulation module 20, a pull-up PMOS transistor 40, and a pull-down module 30 that is turned on or off corresponding to the pull-up module 10.

In the subthreshold ratioed logic circuit, since the pull-up module 10 and the pull-down module 30 are connected with the same input signal, when the pull-up module 10 is turned on, the pull-down module 30 is also turned on like the pull-up module 10; when the pull-up module 10 is turned off, the pull-down module 30 is also turned off like the pull-up module 10. For example, if the pull-up module 10 has multiple devices or multiple branches, the pull-down module 30 correspondingly also comprises multiple devices or multiple branches, and the device in the pull-down module 30 is simultaneously turned on or off at the same time as the corresponding device in the pull-up module 10; or the branch in the pull-down module 30 is simultaneously turned on or off at the same time as the corresponding branch in the pull-up module 10.

Specifically, as shown in FIG. 1, the first end of the pull-up module 10 is connected with an external circuit that provides an input signal, the second end of the pull-up module 10 is connected with the source of the pull-up PMOS transistor 40 and a power supply VDD, and the third end of the pull-up module 10 is connected with the second end of the voltage regulation module 20; the first end of the voltage regulation module 20 is connected with a compensation adjustment circuit that provides a compensation signal, the third end of the voltage regulation module 20 is grounded, and the connection node of the second end of the voltage regulation module 20 and the third end of the pull-up module 10 is connected with the gate of the PMOS transistor 40; the drain of the pull-up PMOS transistor 40 is connected with the output of the subthreshold ratioed logic circuit, the drain of the pull-up PMOS transistor 40 is also connected with the second end of the pull-down module 30, the first end of the pull-down module 30 is connected with an external circuit, the third end of the pull-down module 30 is grounded; the pull-up module 10 and the pull-down module 30 are turned on or off according to the input signal, and control the pull-up current of the pull-up PMOS transistor 40 in combined with the voltage regulation module 20, so that the output of the subthreshold ratioed logic circuit can quickly outputs a level signal.

It should be noted that, in an embodiment of the present disclosure, the pull-up module 10, the pull-down module 30, and the voltage regulation module 20 are all in a subthreshold conduction state when turned on. The operating voltages of the pull-up module 10, the pull-down module 30, and the voltage regulation module 20 are all lower than 0.4V, that is, the operating voltage VDD provided by the power supply is lower than 0.4V.

Alternatively, the input signals received by the pull-up module 10 and the pull-down module 30 of the embodiment of the present disclosure are the same logic signal.

In an embodiment of the present disclosure, the pull-up module 10 can include a plurality of parallel pull-up branches, the both ends of all of the pull-up branches are respectively connected in parallel, and the both parallel connection nodes at both ends are taken as the second end and the third end of the pull-up module 10. Further, in an embodiment, each of the pull-up branches can have multiple input ends, and the input ends are connected with an external circuit for receiving an input signal. That is, in this embodiment, the input ends of each of the pull-up branches are independently connected with the external circuit, the input of all of the pull-up branches form the first end of the pull-up module 10, in other words, the first end of the pull-up module 10 comprises a plurality of inputs.

Each of the pull-up branches can include a plurality of MOS transistors connected in series, the gates of all of the MOS transistors form the first end of the pull-up module 10, they are respectively used to receive the input signals, and the gate of each MOS transistor is independently connected with the external circuit, that is, the gate of each MOS transistor is not connected to others. Further, the MOS transistors connected in series in each of the pull-up branches can be a PMOS transistor or an NMOS transistor. In the actual circuit design, the design of the pull-down module 30 can be referenced. The PMOS transistor can be used in the pull-up branch of the pull-up module 10, when there is a negation signal in the pull-down module 30. At the same time, because the ability of the PMOS transistor to transfer a high level is stronger than that of the NMOS transistor, when the PMOS transistor is used in the pull-up branch, the signal transmission speed can be improved.

The pull-down module 30 comprises a plurality of parallel pull-down branches, and the both ends of all the pull-down branches are respectively connected in parallel, and the both parallel connection nodes at both ends are taken as the second end and the third end of the pull-up module 10. Further, in an embodiment, each of the pull-down branches comprises a plurality of inputs, and the inputs are connected with the external circuit for receiving the input signal. In the embodiment, the inputs of each of the pull-down branches are independently connected with the external circuit, and the inputs of all the pull-down branches constitute the first end of the pull-down module 30, in other words, the first end of the pull-down module 30 comprises multiple inputs.

Further, in an embodiment of the present disclosure, each of the pull-down branches in the pull-down module 30 has a one-to-one correspondence with the pull-up branches of the pull-up module 10. The number of pull-down branches of the pull-down module 30 is the same as the number of pull-up branches of the pull-up module 10, and when one pull-up branches of the pull-up module 10 is turned on, the pull-down branch corresponding to the pull-up branch in the pull-down module 30 is also turned on, and similarly, when one pull-up branch is turned off, the pull-down branch corresponding to the pull-up branch in the pull-down module 30 is also turned off.

Alternatively, each of the pull-down branches comprises a plurality of MOS transistors connected in series, and the gates of all the MOS transistors form the first end of the pull-down module 30 for receiving input signals and the gates of each MOS transistor are independently connected to the external circuit. Further, the MOS transistors connected in series in each of the pull-down branches are NMOS transistors.

The voltage regulation module 20 can comprise two NMOS transistors in series for adjusting the voltage level of the node X in conjunction with the pull up module 10.

Specifically, the voltage regulation module 20 and the pull-up module 10 adjust the voltage of the node X together, thereby controlling the pull-up current of the pull-up PMOS transistor 40, so that the output $V_{out}$ is moved toward the logic level of the target. For example, when the circuit needs a logic zero or low lever output, the pull-up module 10 and the voltage regulation module 20 have corresponding branches turned on at the same time, wherein, the pull-up module 10 pulls up the voltage of the node X and suppresses the charging current of the pull-up PMOS transistor 40, and the pull-down module 30 can simultaneously pull down the output $V_{out}$ to the low level, and through the synergy of the three modules, the output $V_{out}$ can be quickly discharged to near zero level.

Or, when the circuit needs a logic high level output, the output $V_{out}$ will change from low level to high level, at this time, the pull-up module 10 and the pull-down module 30 are both in the off state, and the voltage regulation module 20 is in the on state, through the conduction function of the voltage regulation module 20, and the voltage of the node X is pulled down to a zero potential, the pull-up PMOS transistor 40 generates a sufficiently strong current to raise the output to a high level.

It should be noted that, in an embodiment of the present disclosure, the pull-up module 10, the pull-down module 30, and the voltage regulation module 20 are all in a subthreshold conduction state when turned on.

It can be seen that the present disclosure, compared with the conventional Pseudo-NMOS circuit, in the case that the load current of the pull-up PMOS transistor 40 is controllable, the output can overcome the key bottleneck problem that the discharge process and the potential cannot be pulled down due to the weak pull-down network current during the sub-threshold power supply, and the robustness is enhanced. There is an advantage of simplifying layout and routing complexity with respect to differential logic circuits, and since the differential logic circuit requires an inverted input signal, and it is not required and can achieve faster speeds in the present disclosure. For example, when compared with a current mode differentia structure with a much higher speed, such as a common source logic circuit, there is an ability to operate at lower voltage while simplifying layout wiring due to the presence of a common mode NMOS transistor tail current in the present disclosure.

Figure 2:
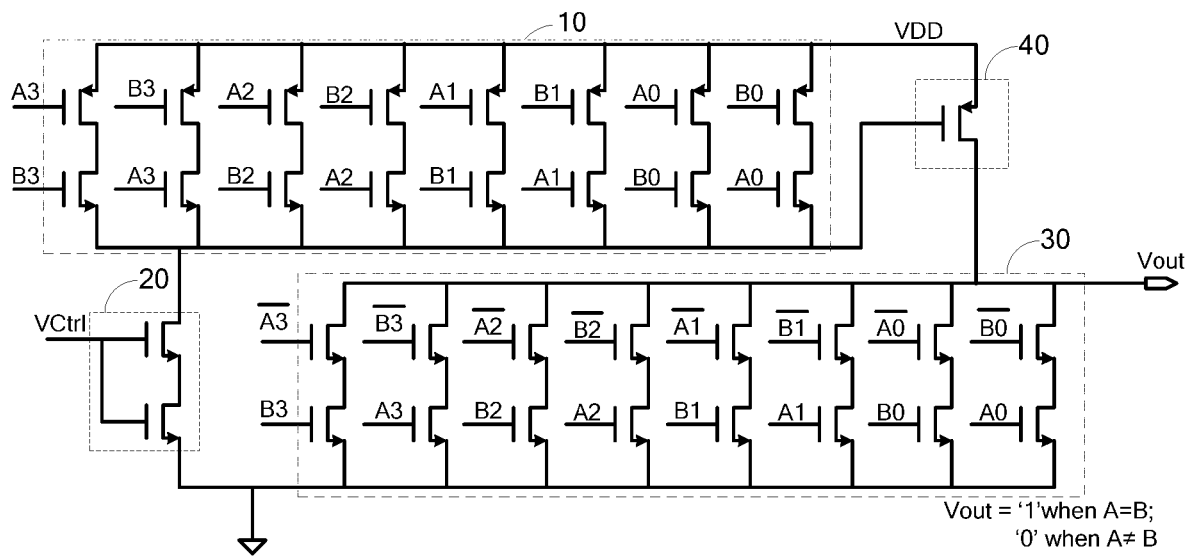
FIG. 2 is a circuit schematic diagram of a specific embodiment of the subthreshold ratioed logic circuit of the present disclosure.

Referring to FIG. 2, FIG. 2 is a schematic circuit diagram of an embodiment of the subthreshold ratioed logic circuit according. Specifically, the subthreshold ratioed logic circuit of this embodiment is a circuit schematic of a 4-bit equivalent comparator.

As shown in FIG. 2, the 4-bit equivalent comparator comprises a pull-up module 10, a pull-down module 30, a pull-up PMOS transistor 40, and a voltage regulation module 20.

The pull-up module 10 comprises eight pull-up branches, and each of the pull-up branches comprises two MOS transistors connected in series, and the two series connected MOS transistors are a PMOS transistor and an NMOS transistor. As shown in FIG. 2, the drain of the PMOS transistor in each pull-up branch is connected in series with the drain of the NMOS transistor, the gate of the PMOS transistor and NMOS transistor in each of the pull-up branches are respectively connected with the external circuit; the sources of the PMOS transistors in all of the pull-up branches are connected in parallel, and the parallel connection node is connected with the source of the pull-up PMOS transistor 40 as the second end of the pull-up module 10; the sources of the NMOS transistors in all of the pull-up branches are connected in parallel, and the parallel connection node is connected with the voltage regulation module 20 as the third end of the pull-up module 10, the detail is that, the parallel connection node is connected with the second end of the voltage regulation module 20.

Correspondingly, the pull-down module 30 also comprises eight pull-down branches, and each of the pull-down branches comprises two MOS transistors connected in series, and the two MOS transistors are a first NMOS transistor and a second NMOS transistor. As shown in FIG. 2, the drains of the first NMOS transistors in all the pull-down branches are connected in parallel, and the parallel connection node is connected with the drains of the pull-up PMOS transistors 40 as the second end of the pull-down modules 30; the sources of the second NMOS transistors in all the pull-down branches are connected in parallel, and the parallel connection node is grounded as the third end of the pull-down module 30; the source of the first NMOS transistor and the drain of the second NMOS transistor are connected in series in each of the pull-down branches, and the gate of the first NMOS transistor and the gate of the second NMOS transistor in each of the pull-down branches are respectively connected with the external circuit.

The voltage regulation module 20 comprises two NMOS transistors connected in series, the drain of one of the NMOS transistors is connected with the gate of the pull-up module 10 and the pull-up PMOS transistor 40 as the second end of the voltage regulation module 20, the source is connected in series with the drain of another NMOS transistor, and the gate is connected with the compensation adjustment circuit; the source of the other NMOS transistor is grounded as the third end of the voltage regulation module 20, and the gate is connected with the compensation adjustment circuit.

As shown in FIG. 2, the operating voltage VDD of the 4-bit equivalent comparator is lower than 0.4V. The pull-up branches from left to right in the pull-up module 10 and the pull-down branches from left to right in the pull-down module 30 are in one-to-one correspondence. The working principle of the equivalent comparator is explained by taking one of the branches as an example.

Specifically, the rightmost pull-up branch of the pull module 10 is taken as an example. Correspondingly, the rightmost pull-down branch of the pull-down module 30 corresponds to the pull-down branch. As shown in FIG. 2, when the input signal of B0 is low (0), the PMOS transistor is turned on; when the input signal of A0 is high (1), the NMOS transistor of the branch is turned on. Since the rightmost pull-down branch of the pull-down module 30 and the rightmost pull-down branch of the pull-up module 10 have the same input signal, $\overline{B0}$ in the first NMOS transistor in the rightmost pull-down branch of the pull-down module 30 is high (1), A0 in the second NMOS transistor is also high (1), and the both NMOS transistors in the rightmost pull-down branch are turned on. Or, when the input signal of B0 is high (1), the PMOS transistor is turned off; when the input signal of A0 is low (0), the NMOS transistor of the branch is turned off. Since the rightmost pull-down branch of the pull-down module 30 and the rightmost pull-down branch of the pull-up module 10 have the same input signal, $\overline{B0}$ in the first NMOS transistor in the rightmost pull-down branch of the pull-down module 30 is low (0), A0 in the second NMOS transistor is also low (0), and the both NMOS transistors in the rightmost pull-down branch are turned off.

It can be seen that when any one of the pull-up branches of the pull-up module 10 is turned on, the pull-down branch corresponding to the pull-up branch in the pull-down module 30 is also turned on; or when one pull-down branches in the pull-up module 10 is turned off, the pull-down branch corresponding to the pull-up branch in the pull-down module 30 is also turned off.

Its specific working principle is, when the input signal changes, the circuit output $V_{out}$ needs to output a low level, in details, the output $V_{out}$ has a change from a high level to a low level, and at the same time, any one or more pull-up branches in the pull-up module 10 are turned on, One or more pull-down branches corresponding to the pull-up module 10 in the pull-down module 30 are also turned on, and the voltage regulation module 20 and the pull-up module 10 work together to raise the voltage of the node X, and suppress the pull-up current of the pull-up PMOS transistor 40, since the pull-down module 30 is also in an on state, the output $V_{out}$ can be pulled down to a low level by the action of the pull-down module 30, and finally the output $V_{out}$ is quickly outputted to a low level.

Or, when the input signal changes, the circuit output $V_{out}$ needs to output a high level, in details, the output $V_{out}$ has a change from a low level to a high level, at the same time, the pull-up module 10 and the pull-down module 30 are both in an off state, the voltage regulation module 20 is in an on state, and through the action of the voltage regulation module 20, the voltage of the node X can be quickly pulled down to zero so that the pull-up PMOS transistor 40 generates a sufficiently strong current, thereby causing the output Vout to quickly output a high level.

Figure 3:
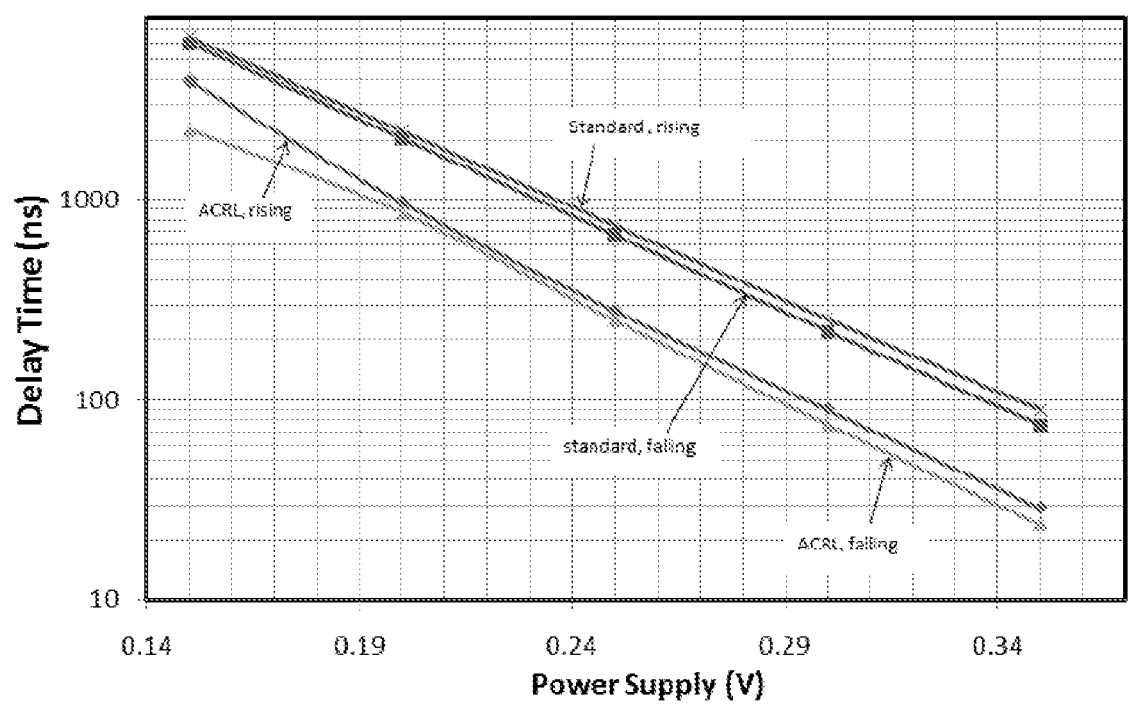
FIG. 3 is a timing comparison diagram of the circuit of FIG. 2 and conventional embodiment.

As shown in FIG. 3, there is comparison of delays of the ratioed logic 4-bit equivalent comparator for ultra low voltage dynamic control of the present disclosure (ACRL, Active Control Ratioed Logic 4-bit equivalent comparator) and the standard comparator (Standard comparator). As can be seen from FIG. 3, the 4-bit equivalent comparator of the present disclosure has a 50%-70% timing increase over conventional standard comparators.

By implementing the ACRL of the present disclosure, the pull-up current of the pull-up PMOS transistor 40 is dynamically controlled by the pull-up module 10 according to the change of the input signal, and all these can make it unnecessary for the present disclosure to produce a symmetrical topology, and further optimize circuit structure and layout area while maintaining speed advantage, and maintain low power consumption. At the same time, as commercial integrated circuit manufacturing processes move toward smaller size, as more and more medical human body chips are used in epilepsy observation smart handheld devices and passive wireless communication devices for all aspects of production and life, in order to maintain low power consumption and low static leakage current, prolong the battery life or extend to farther wireless recognition distance, the supply voltage of the circuit system can only approach or even lower than the threshold voltage of the transistor. In general, in the design of digital integrated circuits, the design of the present disclosure can be employed so that the final design can operate in an ultra-low voltage and ultra-low power environment.

Further, the underlying logic cell design of the transistor stage can substantially improve the instability of the digital integrated circuit when operating at ultra-low voltages, and improve the speed of logic signal transmission, so that the circuit can maintain a certain performance in a low voltage environment. For the medical industry, when the process size of integrated circuits is moving to ultra-deep submicron or even nano-scale, the functional requirements and endurance requirements of human medical chips will only become higher and higher, and the necessity of using sub-threshold levels as working voltages in internal digital systems will become more and more urgent. Therefore, carrying out research on the optimization of sub-threshold basic logic circuits structural and mastering the key design techniques of low-voltage digital circuit infrastructure module for CMOS processes of 45 nm or lower can lay a solid foundation for the development of high-end low-power medical human body chips and handheld products and medium- and long-range passive components, which has long-term significance. At the same time, for the future FinFET process or SOI (Silicon on Insulator) process that may become mainstream after the bulk silicon CMOS process, the present disclosure also provides a very high value reference solution for low voltage, low power, and low leakage current circuit design.

In addition, the subthreshold ratioed logic circuit of the present disclosure utilizes the characteristic that the pull-up current can vary according to different input signals, accelerates the process of signal transmission, and enhances the ability of the output to pull down at the output zero value. Compared with the conventional Pseudo-NMOS circuit, in the case that the load current of the pull-up PMOS is controllable, the output can overcome the key bottleneck problem that the discharge process and the potential cannot be pulled down due to the weak pull-down network current during the sub-threshold power supply, and the robustness is enhanced. There is an advantage of simplifying layout and routing complexity with respect to differential logic circuits, and since the differential logic style requires an inverted input signal, it can achieve relatively faster speeds in this present disclosure. When compared with a current mode differential structure with a much higher speed, such as a common source logic, due to the presence of its common mode NMOS tail current, there is an ability to operate at lower voltages while simplifying layout wiring in the present disclosure.

There is also a chip having the above subthreshold ratioed logic circuit in the present disclosure. In various embodiments of the present, the chip contains, but is not limited to, a digital integrated chip or a passive radio frequency chip or the like.

The contents described above are only preferred embodiments of the present disclosure, but the scope of the present disclosure is not limited to the embodiments. Any modifications or replacements of equivalent structures or equivalent processes made by using the specification and the drawings of the present disclosure, or any directly or indirectly application to other related technical fields, should be included in the protection scope of the present disclosure.

It is to be understood that those skilled in the art can make modifications and changes in the form of the above description, and all such modifications and changes are intended to be included within the scope of the appended claims.

What is claimed is:

1. A subthreshold ratioed logic circuit, wherein, comprising a pull-up module, a voltage regulation module, a pull-up PMOS transistor, and a pull-down module corresponding to the pull-up module that is turned on or off;
   the first end of the pull-up module is connected with an external circuit that provides an input signal, the second end of the pull-up module is connected with the source of the pull-up PMOS transistor and a power supply VDD, and the third end of the pull-up module is connected with the second end of the voltage regulation module;
   the first end of the voltage regulation module is connected with a compensation adjustment circuit that provides a compensation signal, the third end of the voltage regulation module is grounded, and the connection node of the second end of the voltage regulation module and the third end of the pull-up module is also connected with the gate of the pull-up PMOS transistor;
   the drain of the pull-up PMOS transistor is connected with the output of the subthreshold ratioed logic circuit, and the drain of the pull-up PMOS transistor is also connected with the second end of the pull-down module, and the first end of the pull-down module is connected with the external circuit, the third end of the pull-down module is grounded;
   the pull-up module and the pull-down module are turned on or off according to the input signal, and control the pull-up current of the pull-up PMOS transistor in combined with the voltage regulation module, so that the output of the subthreshold ratioed logic circuit can quickly output a level signal;
   wherein, the pull-up module, the pull-down module, and the voltage regulation module are all sub-threshold conduction states when turned on.

2. The subthreshold ratioed logic circuit according to claim 1, wherein the pull-up module comprises multiple parallel pull-up branches, the both ends of all of the pull-up branches are respectively connected in parallel, and the both parallel connection nodes at both ends are taken as the second end and the third end of the pull-up module.

3. The subthreshold ratioed logic circuit according to claim 2, wherein each of the pull-up branches comprises a plurality of MOS transistors connected in series, the gates of all of the MOS transistors form the first end of the pull-up module, and the gate of each of the MOS transistors is independently connected with the external circuit.

4. The subthreshold ratioed logic circuit according to claim 3, wherein each of the pull-up branches comprises two MOS transistors connected in series, and the two MOS transistors in series comprise a PMOS transistor and an NMOS transistor;
   the sources of the PMOS transistors in all of the pull-up branches are connected in parallel, and the nodes connected in parallel are connected as the source of the pull-up PMOS transistor as the second end of the pull-up module; the sources of the NMOS transistors in all of the pull-up branches are connected in parallel, and the nodes connected in parallel are connected to the voltage regulation module as the third end of the pull-up module;
   the drain of the PMOS transistor is connected with the drain of the corresponding NMOS transistor in each of the pull-up branches, the gate of the PMOS transistor and the gate of the NMOS transistor in each of the pull-up branches are respectively connected with the external circuit.

5. The subthreshold ratioed logic circuit according to claim 2, wherein the pull-down module comprises multiple parallel pull-down branches, the both ends of all of the pull-down branches are respectively connected in parallel, and the both parallel connection nodes at both ends are taken as the second end and the third end of the pull-down module.

6. The subthreshold ratioed logic circuit according to claim 5, wherein each of the pull-down branches of the pull-down module has a one to one corresponding with the pull-up branches of the pull-up module.

7. The subthreshold ratioed logic circuit according to claim 5, wherein each of the pull-down branches comprises a plurality of MOS transistors connected in series, the gate of all of the MOS transistors forming the first end of the pull-down module, and the gate of each of the MOS transistors is independently connected to the external circuit.

8. The subthreshold ratioed logic circuit according to claim 7, wherein each of the pull-down branches comprises two MOS transistors connected in series, and the two MOS transistors connected in series include a first NMOS transistor and a second NMOS transistor;
the drains of the first NMOS transistors in all of the pull-down branches are connected in parallel, and the connection nodes are connected with the drains of the pull-up PMOS transistors as the second ends of the pull-down modules; the sources of the second NMOS transistors in all of the pull-down branches are connected in parallel, and the connection nodes are grounded as the third end of the pull-down module;
the source of the first NMOS transistor is connected in series with the drain of the second NMOS transistor in each of the pull-down branches, and the gate of the first NMOS transistor and the second NMOS transistor in each of the pull-down branches are respectively connected to the external circuit.

9. The subthreshold ratioed logic circuit according to claim 1, wherein the voltage regulation module comprises two NMOS transistors connected in series;
the drain of one of the two series-connected NMOS transistors is connected with the gate of the pull-up module and the pull-up PMOS transistor as the second end of the voltage regulation module, and the source is connected with the drain of another NMOS transistor, the gate is connected with the gate of the another NMOS transistor and also connected with the compensation adjustment circuit;
the source of the another NMOS transistor is grounded as the third end of the voltage regulation module.

10. A chip, comprises a subthreshold ratioed logic circuit, wherein, the subthreshold ratioed logic circuit comprising a pull-up module, a voltage regulation module, a pull-up PMOS transistor, and a pull-down module corresponding to the pull-up module that is turned on or off;
the first end of the pull-up module is connected with an external circuit that provides an input signal, the second end of the pull-up module is connected with the source of the pull-up PMOS transistor and a power supply VDD, and the third end of the pull-up module is connected with the second end of the voltage regulation module;
the first end of the voltage regulation module is connected with a compensation adjustment circuit that provides a compensation signal, the third end of the voltage regulation module is grounded, and the connection node of the second end of the voltage regulation module and the third end of the pull-up module is also connected with the gate of the pull-up PMOS transistor;
the drain of the pull-up PMOS transistor is connected with the output of the subthreshold ratioed logic circuit, and the drain of the pull-up PMOS transistor is also connected with the second end of the pull-down module, and the first end of the pull-down module is connected with the external circuit, the third end of the pull-down module is grounded;
the pull-up module and the pull-down module are turned on or off according to the input signal, and control the pull-up current of the pull-up PMOS transistor in combined with the voltage regulation module, so that the output of the subthreshold ratioed logic circuit can quickly output a level signal;
wherein, the pull-up module, the pull-down module, and the voltage regulation module are all sub-threshold conduction states when turned on.

11. The chip according to claim 10, wherein the pull-up module comprises multiple parallel pull-up branches, the both ends of all of the pull-up branches are respectively connected in parallel, and the both parallel connection nodes at both ends are taken as the second end and the third end of the pull-up module.

12. The chip according to claim 11, wherein each of the pull-up branches comprises a plurality of MOS transistors connected in series, the gates of all of the MOS transistors form the first end of the pull-up module, and the gate of each of the MOS transistors is independently connected with the external circuit.

13. The chip according to claim 12, wherein each of the pull-up branches comprises two MOS transistors connected in series, and the two MOS transistors in series comprises a PMOS transistor and an NMOS transistor;
the sources of the PMOS transistors in all of the pull-up branches are connected in parallel, and the nodes connected in parallel are connected as the source of the pull-up PMOS transistor as the second end of the pull-up module; the sources of the NMOS transistors in all of the pull-up branches are connected in parallel, and the nodes connected in parallel are connected to the voltage regulation module as the third end of the pull-up module;
the drain of the PMOS transistor is connected with the drain of the corresponding NMOS transistor in each of the pull-up branches, the gate of the PMOS transistor and the gate of the NMOS transistor in each of the pull-up branches are respectively connected with the external circuit.

14. The chip according to claim 11, wherein the pull-down module comprises multiple parallel pull-down branches, the both ends of all of the pull-down branches are respectively connected in parallel, and the both parallel connection nodes at both ends are taken as the second end and the third end of the pull-down module.

15. The chip according to claim 14, wherein each of the pull-down branches of the pull-down module has a one to one corresponding with the pull-up branches of the pull-up module.

16. The chip according to claim 14, wherein each of the pull-down branches comprises a plurality of MOS transistors connected in series, the gate of all of the MOS transistors forming the first end of the pull-down module, and the gate of each of the MOS transistors is independently connected to the external circuit.

17. The chip according to claim 16, wherein each of the pull-down branches comprises two MOS transistors connected in series, and the two MOS transistors connected in series include a first NMOS transistor and a second NMOS transistor;

the drains of the first NMOS transistors in all of the pull-down branches are connected in parallel, and the connection nodes are connected with the drains of the pull-up PMOS transistors as the second ends of the pull-down modules; the sources of the second NMOS transistors in all of the pull-down branches are connected in parallel, and the connection nodes are grounded as the third end of the pull-down module;

the source of the first NMOS transistor is connected in series with the drain of the second NMOS transistor in each of the pull-down branches, and the gate of the first NMOS transistor and the second NMOS transistor in each of the pull-down branches are respectively connected to the external circuit.

18. The chip according to claim 11, wherein the voltage regulation module comprises two NMOS transistors connected in series;

the drain of one of the two series-connected NMOS transistors is connected with the gate of the pull-up module and the pull-up PMOS transistor as the second end of the voltage regulation module, and the source is connected with the drain of another NMOS transistor, the gate is connected with the gate of the another NMOS transistor and also connected with the compensation adjustment circuit;

the source of the another NMOS transistor is grounded as the third end of the voltage regulation module.

* * * * *